United States Patent
Aoki et al.

(10) Patent No.: US 9,134,070 B2
(45) Date of Patent: Sep. 15, 2015

(54) RADIATOR AND ELECTRONIC APPARATUS INCLUDING SAME

(71) Applicant: FUJITSU LIMITED, Kawasaki-shi, Kanagawa (JP)

(72) Inventors: Michimasa Aoki, Kawasaki (JP); Masumi Suzuki, Kawasaki (JP); Yosuke Tsunoda, Tachikawa (JP)

(73) Assignee: FUJITSU LIMITED, Kawasaki (JP)

( * ) Notice: Subject to any disclaimer, the term of this patent is extended or adjusted under 35 U.S.C. 154(b) by 309 days.

(21) Appl. No.: 13/756,964

(22) Filed: Feb. 1, 2013

(65) Prior Publication Data
US 2013/0201628 A1    Aug. 8, 2013

(30) Foreign Application Priority Data
Feb. 3, 2012 (JP) ................................. 2012-022311

(51) Int. Cl.
| | |
|---|---|
| *H05K 7/20* | (2006.01) |
| *F28D 1/047* | (2006.01) |
| *G06F 1/20* | (2006.01) |
| *F28F 9/02* | (2006.01) |
| *F28F 9/26* | (2006.01) |

(52) U.S. Cl.
CPC ............ *F28D 1/0476* (2013.01); *F28F 9/0202* (2013.01); *F28F 9/262* (2013.01); *G06F 1/20* (2013.01); *H05K 7/20218* (2013.01); *H05K 7/20781* (2013.01)

(58) Field of Classification Search
CPC ............. F28D 1/0476; H05K 7/20218; H05K 7/20781; G06F 1/20; F28F 9/262; F28F 9/0202
USPC ........................ 361/679.46–679.54, 688–723; 165/148–153, 80.1–80.5
See application file for complete search history.

(56) References Cited

U.S. PATENT DOCUMENTS

| | | | | |
|---|---|---|---|---|
| 2006/0131009 | A1* | 6/2006 | Nies ............................ | 165/176 |
| 2011/0272128 | A1* | 11/2011 | Suzuki et al. ................ | 165/185 |
| 2014/0345838 | A1* | 11/2014 | Vallee et al. ................ | 165/170 |

FOREIGN PATENT DOCUMENTS

| | | |
|---|---|---|
| JP | 60-186696 A | 9/1985 |
| JP | 2000-304489 A | 11/2000 |
| JP | 2003-302123 A | 10/2003 |
| JP | 2011-237105 A | 11/2011 |

OTHER PUBLICATIONS

Office Action dated Jun. 30, 2015, issued in corresponding JP Patent Application No. 2012-022311 (with English translation).

* cited by examiner

*Primary Examiner* — Anthony Haughton
*Assistant Examiner* — Yahya Ahmad
(74) *Attorney, Agent, or Firm* — SQUIRE PATTON BOGGS (US) LLP

(57) ABSTRACT

There is provided a radiator which includes a tank including first and second chambers that are separated from each other, the first and second chambers including first and second openings, respectively, a first tube including first and second ends, the first and second ends communicating with the first and second chambers, respectively, and a second tube being next to the first tube, the second tube including first and second ends communicating with the first and second chambers, respectively, wherein the first chamber includes first and second flow channels that communicate with the first opening, the first and second channels being split so as to sandwich at least part of the second chamber, and the first ends of the first and second tubes sandwich the second ends of the first and second tubes.

19 Claims, 9 Drawing Sheets

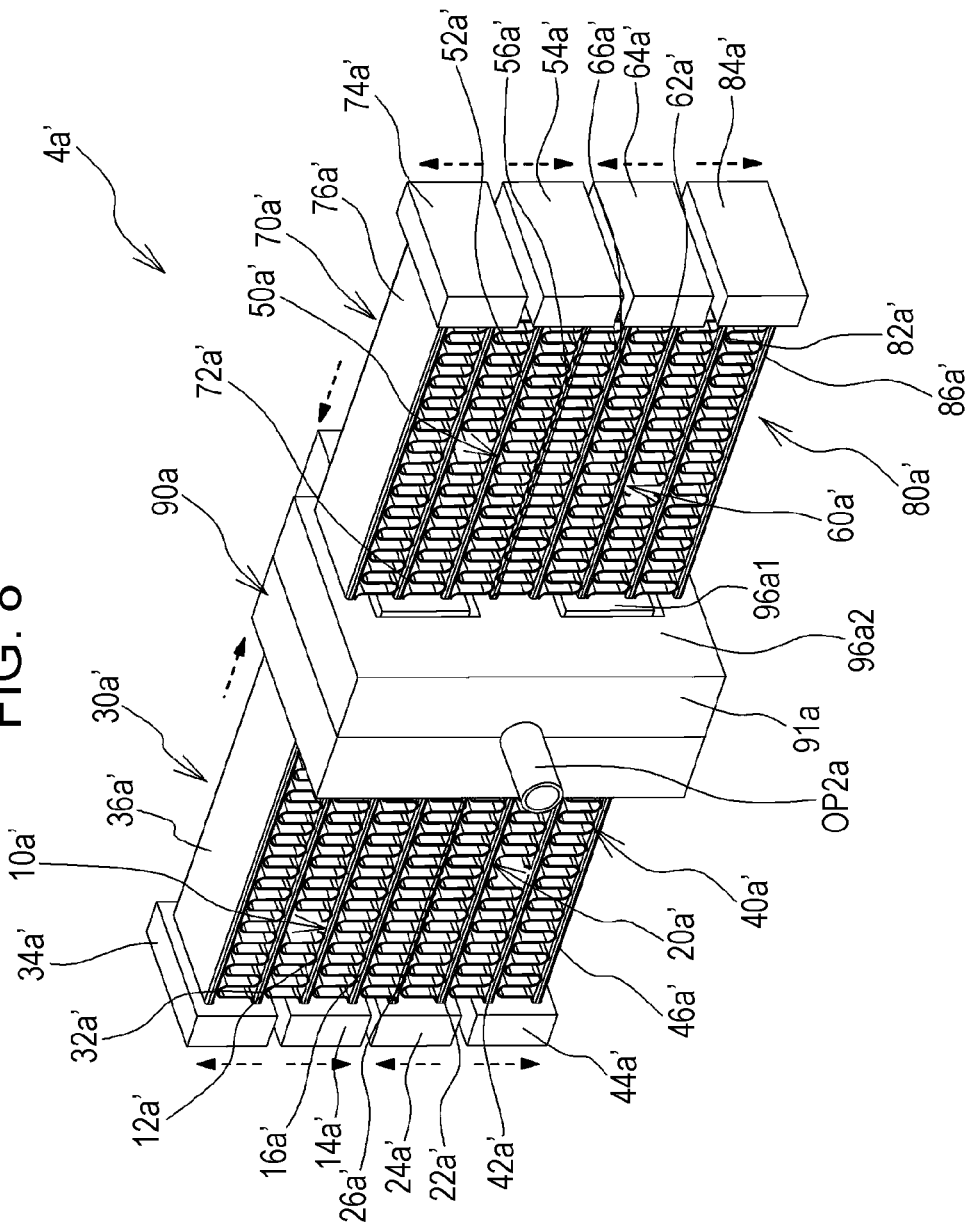

RADIATOR AND ELECTRONIC APPARATUS INCLUDING SAME

CROSS-REFERENCE TO RELATED APPLICATION

This application is based upon and claims the benefit of priority of the prior Japanese Patent Application No. 2012-022311, filed on Feb. 3, 2012, the entire contents of which are incorporated herein by reference.

FIELD

The embodiments discussed herein are related to a radiator and an electronic apparatus including the same.

BACKGROUND

There are radiators for cooling a refrigerant. A radiator includes a tube allowing a refrigerant to pass therethrough, and heat is exchanged between air around the tube and the refrigerant while the refrigerant passes through the tube. In this way the refrigerant passing through the tube is cooled. A technique relating to the radiator is disclosed in Japanese Laid-open Patent Publication No. 2000-304489.

SUMMARY

According to an aspect of the invention, a radiator includes a tank including first and second chambers that are separated from each other, the first and second chambers including first and second openings, respectively, a first tube including first and second ends, the first and second ends communicating with the first and second chambers, respectively, and a second tube being next to the first tube, the second tube including first and second ends communicating with the first and second chambers, respectively, wherein the first chamber includes first and second flow channels that communicate with the first opening, the first and second channels being split so as to sandwich at least part of the second chamber, and the first ends of the first and second tubes sandwich the second ends of the first and second tubes.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 8 illustrates a radiator according to a third embodiment; and

DESCRIPTION OF EMBODIMENTS

Problems

In conventional radiators, to facilitate heat exchange, a fan for blowing air toward a radiator is provided in some cases. Alternatively, when a radiator is mounted on a moving object, a wind occurring with movement of the object is utilized for facilitating heat exchange. The air utilized for heat exchange receives heat from the refrigerant and the temperature of the air becomes high.

While the refrigerant flows through the tube from upstream to downstream, heat is exchanged between the refrigerant and the air, and the temperature of the refrigerant decreases. Accordingly, the temperature at the upstream section of the tube is relatively high, whereas that at the downstream section of the tube is relatively low. Thus, the temperature of air passing through the vicinity of the upstream section of the tube is also relatively high, and that through the vicinity of the downstream section of the tube is also relatively low. In this case, for example, when another component or member or the like is placed downstream of the steam of the air passing through the surroundings of the radiator, a component may be continually subjected to the high-temperature air, depending on the positional relationship between the radiator and the component or the like.

Therefore it is desirable to provide a radiator that may enable reduced imbalances in temperature distribution of air passing through its surroundings and an electronic apparatus that includes the radiator.

Embodiments are described below.

First Embodiment

Figure 1:
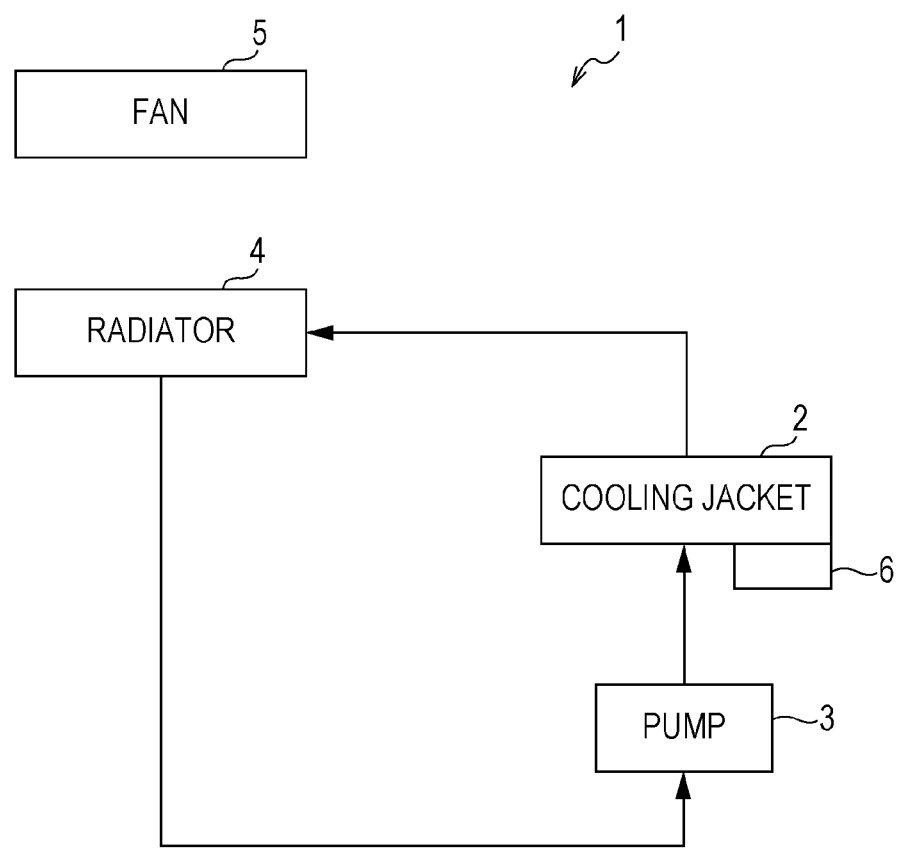
FIG. 1 is an explanatory block diagram of an electronic apparatus related to embodiments.

FIG. 1 is a block diagram of an electronic apparatus. An electronic apparatus 1 may be an information processing apparatus, such as a server, a desktop computer, or a notebook computer, for example. The electronic apparatus 1 includes a cooling system for cooling a heat-generating component 6. The heat-generating component 6 may be an electronic component, such as a central processing unit (CPU), for example, and is a component that receives electric power and generates heat. The cooling system includes a cooling jacket 2, a pump 3, a radiator 4, and a fan 5. The refrigerant circulates in this cooling system. The cooling jacket 2 is in contact with the heat-generating component 6, receives heat from the heat-generating component 6, and transfers the heat to the refrigerant. The pump 3 causes the refrigerant to circulate. The radiator 4 receives the heat from the refrigerant and dissipates it into the air. The fan 5 blows air to the radiator 4. The above-described devices are connected using a metal pipe and a flexible hose. Examples of the refrigerant include, although not limited to, propylene glycol antifreeze.

Figure 2:
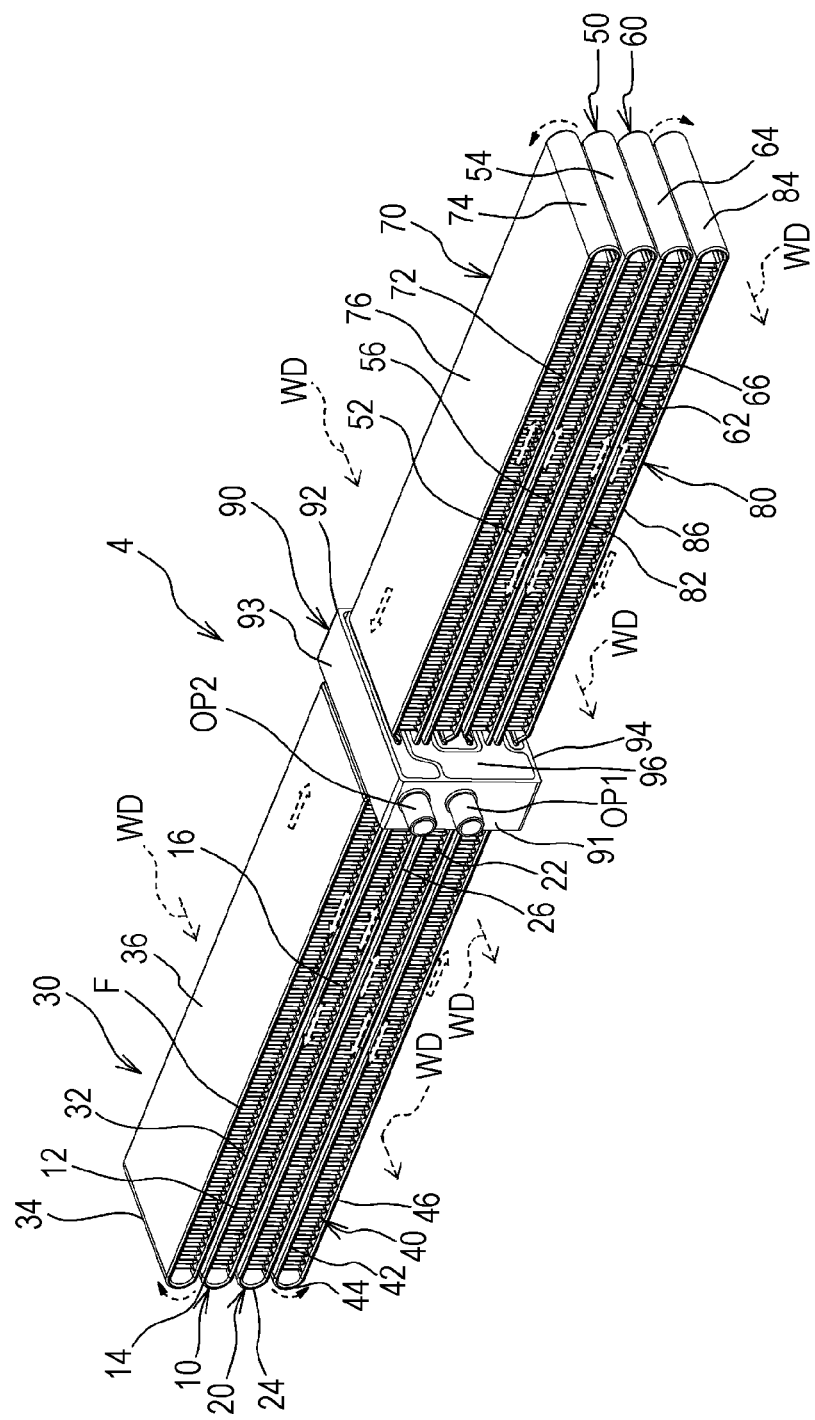
FIG. 2 illustrates a radiator according to a first embodiment.

FIG. 2 illustrates the radiator 4 according to the first embodiment. The radiator 4 includes tubes 10 to 80 and a tank 90 connected to the tubes 10, 20, 30, 40, 50, 60, 70, and 80 which will be described for simplicity as the tubes 10 to 80. Each of the tubes 10 to 80 and tank 90 is made of metal such as aluminum, for example. The refrigerant circulates through the tubes 10 to 80 and tank 90. Each of the tubes 10 to 80 is flat-shaped as illustrated in FIG. 2.

The tubes 10, 20, 30, and 40, which are also described for simplicity as the tubes 10 to 40, are connected to one side surface of the tank 90. The tubes 50 to 80, which are described for simplicity as tubes 50 to 80, are connected to another side surface 96 of the tank 90. Each of the tubes 10 to 80 is loop-shaped and includes first and second ends connected to the tank 90. The tubes 10 and 20 face each other. The tubes 10 and 30 face each other. The tubes 20 and 40 face each other. The tubes 10 and 20 are sandwiched between the tubes 30 and 40. Similarly, the tubes 50 and 60 face each other. The tubes 50 and 70 face each other. The tubes 60 and 80 face each other. The tubes 50 and 60 are sandwiched between the tubes 70 and 80.

The tank 90 includes a front surface 91 on which nozzles OP1 and OP2 extending in the same direction are disposed. The nozzles OP1 and OP2 are connected to hoses. The refrigerant flows between the radiator 4 and the cooling jacket 2 and between the radiator 4 and the pump 3 through the hoses disposed therebetween.

The tube 10 includes a flat portion 12 linearly extending in a predetermined direction, a bent portion 14 contiguous with the flat portion 12, and a flat portion 16 contiguous with the bent portion 14 and extending in parallel to the flat portion 12. Similarly, the tube 20 includes flat portions 22 and 26 and a bent portion 24. The tube 30 includes flat portions 32 and 36 and a bent portion 34. The tube 40 includes flat portions 42 and 46 and a bent portion 44. The tube 50 includes flat portions 52 and 56 and a bent portion 54. The tube 60 includes flat portions 62 and 66 and a bent portion 64. The tube 70 includes flat portions 72 and 76 and a bent portion 74. The tube 80 includes flat portions 82 and 86 and a bent portion 84. The flat portions 12 and 32 face each other. The flat portions 16 and 26 face each other. The flat portions 22 and 42 face each other. The flat portions 52 and 72 face each other. The flat portions 56 and 66 face each other. The flat portions 62 and 82 face each other.

A plurality of fins F are disposed between the flat portions 12 and 16. Similarly, a plurality of fins F are disposed between the flat portions 22 and 26, between the flat portions 32 and 36, between the flat portions 42 and 46, between the flat portions 52 and 56, between the flat portions 62 and 66, between the flat portions 72 and 76, and between the flat portions 82 and 86. The fins F are disposed to enable each of the tubes 10 to 80 to have a sufficient surface area and thus facilitate heat exchange between the refrigerant passing through the tubes 10 to 80 and the air flowing around the tubes 10 to 80. For example, as illustrated in FIG. 1, air from the fan 5 passes between the flat portions 12 and 16 and between the flat portions 12 and 32, which face each other, and the like. Such an air stream is indicated by a direction WD in FIG. 2 as an example.

Routes of a refrigerant introduced through the nozzle OP1 into the tank 90 are indicated by the arrows in FIG. 2. When the refrigerant is introduced through the nozzle OP1 into the tank 90, the refrigerant substantially simultaneously flows in the tubes 10 to 80. Specifically, the refrigerant substantially simultaneously flows along the flat portions 12, 22, 32, 42, 52, 62, 72, and 82. Then, the refrigerant flows along the bent portions 14, 24, 34, 44, 54, 64, 74, and 84. Then, the refrigerant flows along the flat portions 16, 26, 36, 46, 56, 66, 76, and 86. After that, the refrigerant flows into the tank 90 again and then passes through the nozzle OP2. As illustrated in FIG. 2, the tubes 10 to 80 are connected in parallel to the tank 90. An example structure that achieves such a refrigerant stream is described below.

Figure 3:
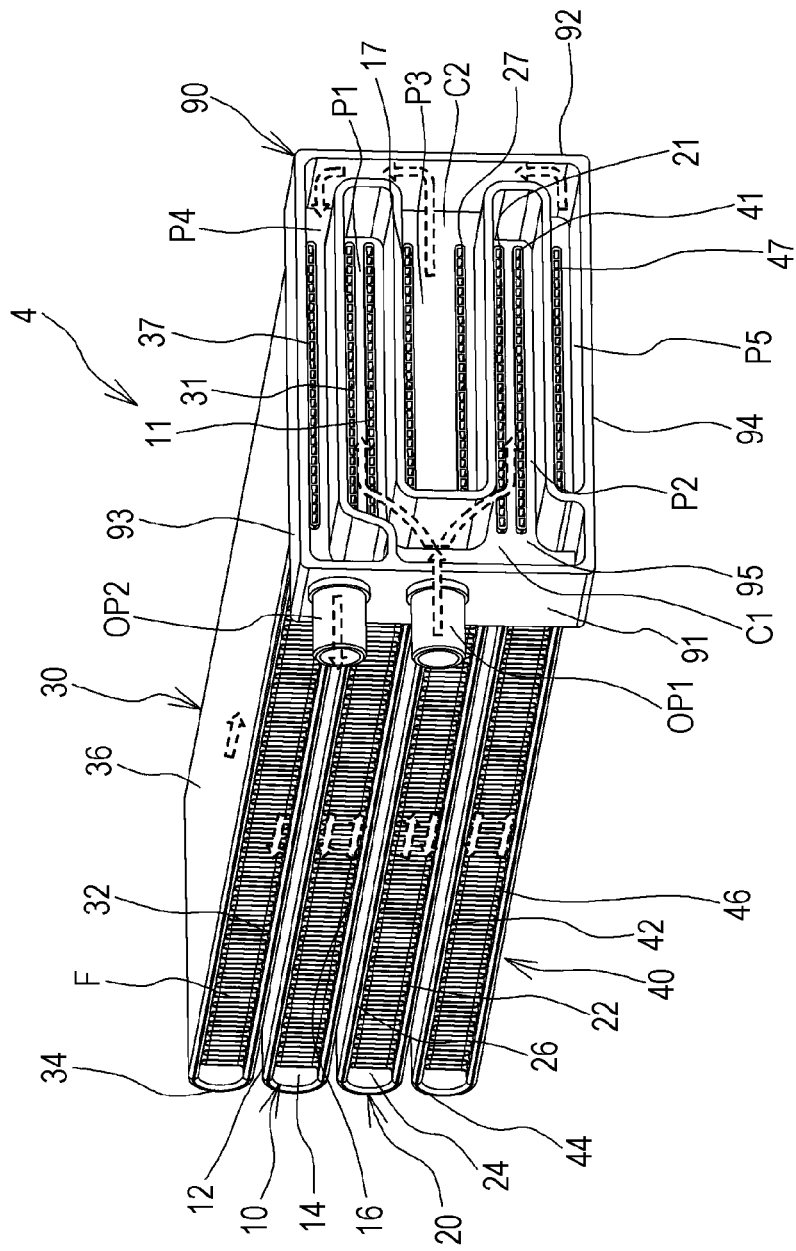
FIG. 3 illustrates a tank in the radiator according to the first embodiment.

FIG. 3 illustrates the tank 90. As illustrated in FIGS. 2 and 3, the tank 90 is a substantially rectangular parallelepiped including the front surface 91, a rear surface 92 opposed to the front surface 91, a top surface 93, a bottom surface 94 opposed to the top surface 93, a side surface 95, and the side surface 96 opposed to the side surface 95. The nozzles OP1 and OP2 are disposed on the front surface 91. The tubes 10 to 40 are connected to the side surface 95. The tubes 50 to 80 are connected to the side surface 96.

The tank 90 includes two chambers C1 and C2. The chambers C1 and C2 are partitioned by a wall in the tank 90. The tank 90 is an example of a tank including first and second chambers including first and second openings, respectively, the first and second chambers being separated from each other. The chamber C1 communicates with the nozzle OP1. The chamber C2 communicates with the nozzle OP2. The nozzles OP1 and OP2 are examples of the first and second openings. The refrigerant introduced through the nozzle OP1 first flows in the chamber C1.

The chamber C1 includes split flow channels P1 and P2 communicating with the nozzle OP1. The chamber C2 includes split flow channels P3, P4, and P5 communicating with the nozzle OP2. The flow channel P4 is adjacent to the top surface 93 of the tank 90. The nozzle OP2 is adjacent to the flow channel P4. The flow channel P5 is adjacent to the bottom surface 94 of the tank 90. The flow channel P3 is positioned between the flow channels P4 and P5 and sandwiched between the flow channels P1 and P2. The flow channels P1 and P2 are examples of first and second flow channels communicating with the first opening and being split so as to sandwich at least part of the second chamber. The flow channel P1 is sandwiched between the flow channels P3 and P4. The flow channel P2 is sandwiched between the flow channels P3 and P5. The flow channels P3 and P4 are examples of third and fourth flow channels communicating with the second opening and being split so as to sandwich the first flow channel. The flow channel P5 is an example of a fifth flow channel communicating with the second opening and being split from the third and fourth flow channels such that the third and fifth flow channels sandwich the second flow channel.

The flow channel P1 communicates with an end 11 of the flat portion 12 of the tube 10 and an end 31 of the flat portion 32 of the tube 30. The flow channel P2 communicates with an end 21 of the flat portion 22 of the tube 20 and an end 41 of the flat portion 42 of the tube 40. The flow channel P3 communicates with an end 17 of the flat portion 16 of the tube 10 and an end 27 of the flat portion 26 of the tube 20. The flow channel P4 communicates with an end 37 of the flat portion 36 of the tube 30. The flow channel P5 communicates with an end 47 of the flat portion 46 of the tube 40. The tube 10 is an example of a first tube including first and second ends communicating with the first and second chambers, respectively. The tube 20 is an example of a second tube being next to the first tube and including first and second ends communicating with the first and second chambers, respectively. The tube 30 is an example of a third tube including a first end communicating with the first flow channel in the first chamber and a second end communicating with the fourth flow channel in the second chamber. The tube 40 is an example of a fourth tube including a first end communicating with the second flow channel in the first chamber and a second end communicating with the fifth flow channel in the second chamber.

The refrigerant introduced through the nozzle OP1 into the chamber C1 flows into the flow channels P1 and P2. The refrigerant having flowed into the flow channel P1 flows along the flat portions 12 and 32. The refrigerant having flowed into the flow channel P2 flows along the flat portions 22 and 42. The refrigerant having flowed along the flat portion 12 flows along the bent portion 14 and the flat portion 16 and then flows into the flow channel P3. The refrigerant having flowed along the flat portion 22 flows along the bent portion 24 and the flat portion 26 and then flows into the flow channel P3. The refrigerant having flowed along the flat portion 32 flows along the bent portion 34 and the flat portion 36 and then flows into the flow channel P4. The refrigerant having flowed along the flat portion 42 flows along the bent portion 44 and the flat portion 46 and then flows into the flow channel P5. The refrigerants flowing into the flow channels P3, P4, and P5 meet, and the combined refrigerant is ejected through the nozzle OP2.

Similarly, the flow channel P1 in the chamber C1 communicates with an end of the flat portion 52 of the tube 50 and an end of the flat portion 72 of the tube 70. The flow channel P2 in the chamber C1 communicates with an end of the flat portion 62 of the tube 60 and an end of the flat portion 82 of the tube 80. The flow channel P3 in the chamber C2 communicates with an end of the flat portion 56 of the tube 50 and an end of the flat portion 66 of the tube 60. The flow channel P4 in the chamber C2 communicates with an end of the flat portion 76 of the tube 70. The flow channel P5 in the chamber C2 communicates with an end of the flat portion 86 of the tube 80. In this way, the refrigerant flows into the tubes 50 to 80 in directions indicated by the arrows illustrated in FIG. 2. The tube 10 is an example of a first-side first tube connected to a first side surface of the tank. The tube 50 is an example of a second-side second tube connected to a second side surface of the tank, the second side surface being opposed to the first side surface.

The tank 90 may be produced by bonding of the side surface 95 and side surface 96 having holes for receiving the ends of the tubes to a member including a wall formed inside and including the front surface 91, rear surface 92, top surface 93, and bottom surface 94. This method, however, is not intended to limit the method of producing the tank 90.

Figure 4:
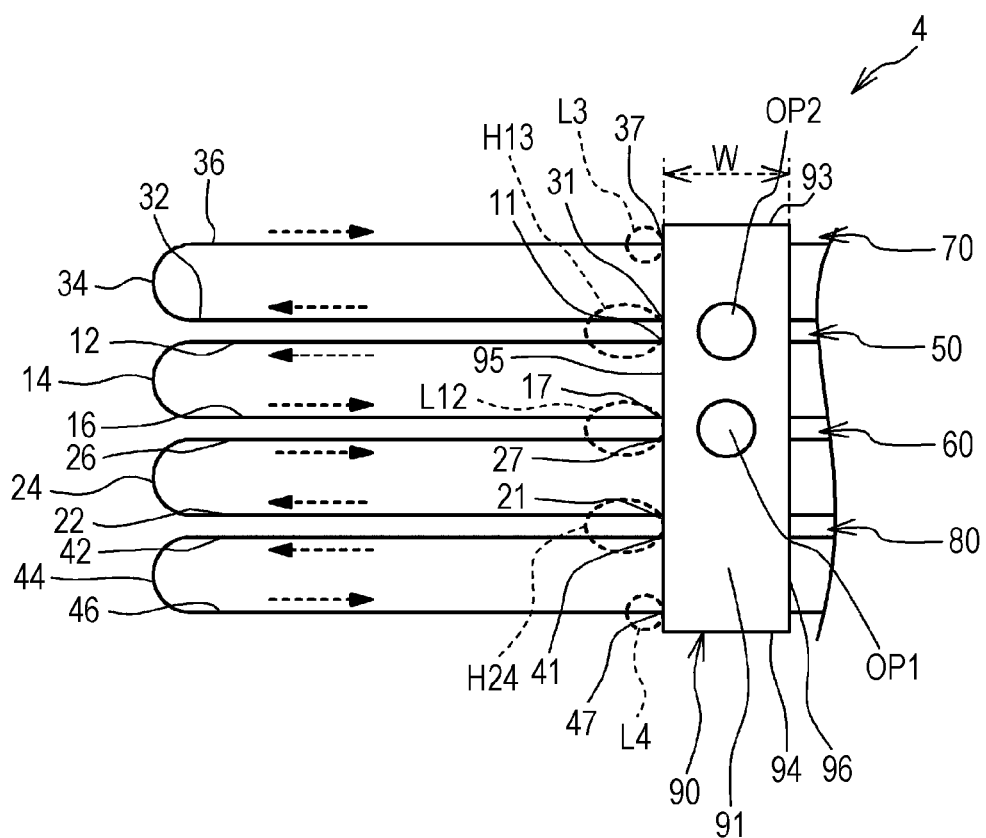
FIG. 4 is a diagram for explaining a temperature of air passing through the surroundings of the radiator according to the first embodiment.

FIG. 4 is an illustration for describing a temperature of air passing through the surroundings of the radiator 4. FIG. 4 illustrates the surroundings of the tubes 10 to 40 of the radiator 4 in a simplified manner. As previously above, the refrigerant introduced into the tank 90 flows to the end 11 of the flat portion 12 of the tube 10, the end 21 of the flat portion 22 of the tube 20, the end 31 of the flat portion 32 of the tube 30, and the end 41 of the flat portion 42 of the tube 40. In returning to the inside of the tank 90, the refrigerant passes through the end 17 of the flat portion 16 of the tube 10, the end 27 of the flat portion 26 of the tube 20, the end 37 of the flat portion 36 of the tube 30, and the end 47 of the flat portion 46 of the tube 40.

Heat is exchanged between the refrigerant and air while the refrigerant flows through the tubes from upstream to downstream, so that the temperature of the refrigerant decreases. Accordingly, the temperature at the upstream section of the tube is relatively high, whereas the temperature at the downstream section of the tube is relatively low. Thus, the temperature of air passing through the vicinity of the upstream section of the tube is relatively high, whereas the temperature of air passing through the vicinity of the downstream section of the tube is relatively low. Accordingly, the temperature at the ends 11, 21, 31, and 41 corresponding to the upstream section is relatively high, whereas the temperature at the ends 17, 27, 37, and 47 corresponding to the downstream section is relatively low. The ends 11 and 31 are next to each other. The ends 17 and 27 are next to each other. The ends 21 and 41 are next to each other. Thus, the temperature of air passing through a vicinity H13 of the ends 11 and 31 and that of air passing through a vicinity H24 of the ends 21 and 41 are relatively high. In contrast, the temperature of air passing through a vicinity L12 of the ends 17 and 27 is relatively low. The temperature of air passing through a vicinity L3 of the end 37 and that through a vicinity L4 of the end 47 are also relatively low.

As illustrated in FIG. 4, the vicinity L12, where its temperature is relatively low, is sandwiched between the vicinities H13 and H24, where their temperatures are relatively high. The vicinity H13, where its temperature is relatively high, is sandwiched between the vicinities L3 and L12, where their temperatures are relatively low. The vicinity H24, where its temperature is relatively high, is sandwiched between the vicinities L12 and L4, where their temperatures are relatively low. This facilitates mixing between the relatively high temperature air having passed through the vicinity of the high-temperature section and the relatively low temperature air having passed through the vicinity of the low-temperature section.

Figure 5A:
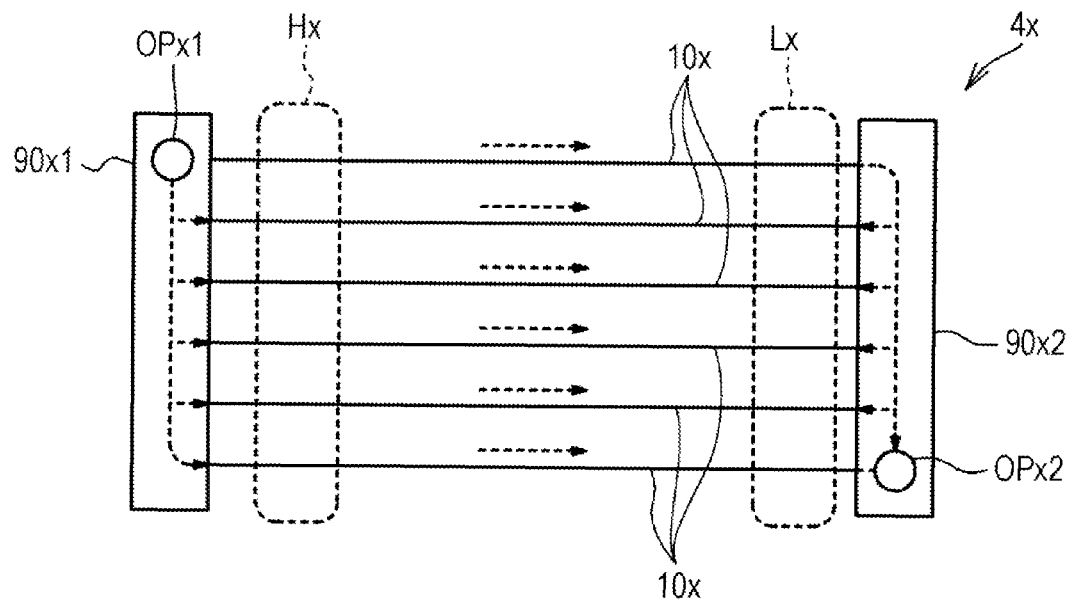
FIGS. 5A and 5B are diagrams for explaining radiators including structures different from the structure of the radiator according to the first embodiment.
Figure 5B:
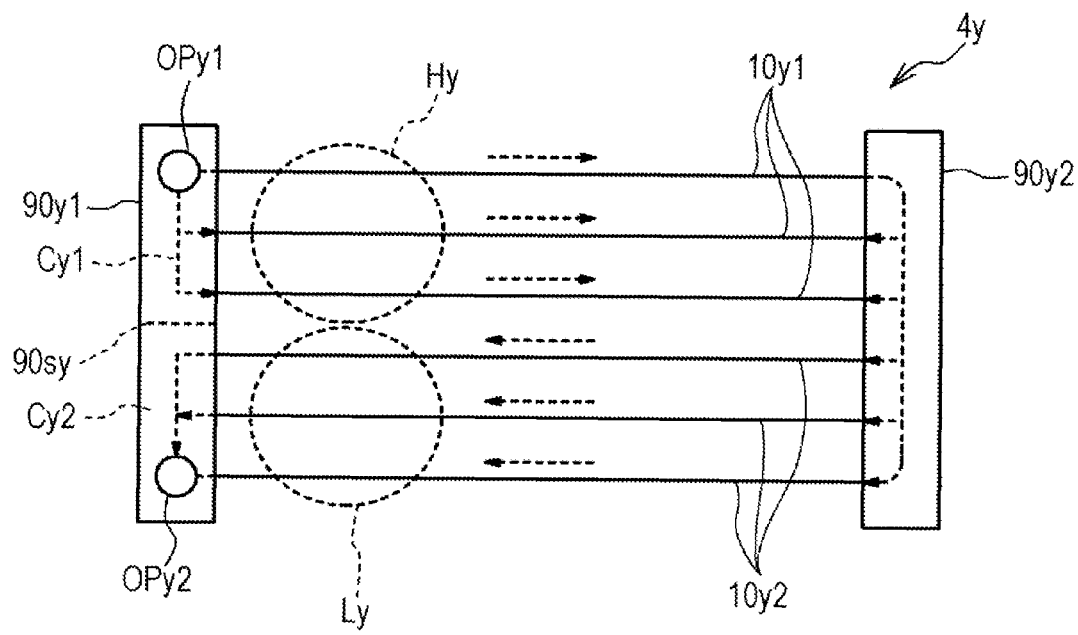

FIGS. 5A and 5B illustrate radiators $4x$ and $4y$ having structures different from the structure of the radiator 4 according to the present embodiment, respectively. As illustrated in FIG. 5A, a plurality of tubes $10x$ are connected between two tanks $90x1$ and $90x2$ in the radiator $4x$. The tank $90x1$ includes a nozzle $OPx1$. The tank $90x2$ includes a nozzle $OPx2$. The tubes $10x$ extend in parallel with each other. The refrigerant introduced into the tank $90x1$ flows through the tubes $10x$ into the tank $90x2$. In FIG. 5A, the direction in which the refrigerant flows is indicated by the arrows.

The refrigerants flowing into the plurality of tubes $10x$ flow in the same direction. Thus, an end of each of the tubes $10x$ that is connected to the tank $90x1$ is the upstream end, whereas another end of each of the tubes $10x$ that is connected to the tank $90x2$ is the downstream end. The temperature of air passing through a vicinity $Hx$ of the upstream ends of the tubes $10x$ is relatively high, whereas that through a vicinity $Lx$ of the downstream ends thereof is relatively low. In this way, the distance between the vicinities $Hx$ and $Lx$ is long. The upstream ends of the neighboring tubes $10x$ are next to each other, and the downstream ends thereof are also next to each other. Thus, the difference between the temperature of air passing through the upstream vicinity $Hx$ and that through the downstream vicinity $Lx$ may be larger.

Consequently, temperature distribution of air passing through the surroundings of the radiator $4x$ is unbalanced. Because of such an imbalance in temperature distribution of air passing through the surroundings of the radiator $4x$, when another component or member or the like is placed downstream of the stream of the air passing through the surroundings of the radiator $4x$, a component may be continually subjected to high-temperature air, depending on the positional relationship between the radiator $4x$ and the component or the like. Thus, the imbalance in temperature distribution may affect the component or the like subjected to the high-temperature air.

Referring to FIG. 5B, a plurality of tubes $10y1$ and $10y2$ are connected between tanks $90y1$ and $90y2$ in the radiator $4y$. The plurality of tubes $10y1$ and $10y2$ extend in parallel with one other. The tank $90y1$ includes nozzles $OPy1$ and $OPy2$. The tank $90y1$ includes a wall $90sy$ for separating the tank $90y1$ into chambers $Cy1$ and $Cy2$. The refrigerant introduced through the nozzle $OPy1$ into the chamber $Cy1$ flows through the tubes $10y1$ to the tank $90y2$. The refrigerant introduced into the tank $90y2$ flows through the tubes $10y2$ to the chamber $Cy2$ in the tank $90y1$. The directions in which the refrigerants flow are indicated by the arrows in FIG. 5B. An end of each of the tubes $10y1$ that is connected to the chamber $Cy1$ is the upstream end, whereas an end of each of the tubes $10y2$ that is connected to the chamber Cy2 is the downstream end. Thus, there is a difference in temperature between air passing through an upstream vicinity Hy and air passing through a downstream vicinity Ly. Accordingly, there is also an imbalance in temperature distribution of air passing through the surroundings of the radiator 4y.

As illustrated in FIG. 4, in the present embodiment, the downstream ends 17 and 27 are sandwiched between the upstream ends 11 and 21, the upstream ends 11 and 31 are sandwiched between the downstream ends 17 and 37, and the upstream ends 21 and 41 are sandwiched between the downstream ends 27 and 47. Thus, relatively high temperature air and relatively low temperature air passing through the vicinities of these ends are alternately positioned, and imbalances in temperature distribution are reduced. Thus, even when another component or member or the like is placed downstream of the stream of air passing through the surroundings of the radiator 4, for example, situations where a component or the like is continually subjected to high-temperature air are reduced. Thus, a decrease in life expectancy of the component or the like may be reduced.

The bent portions 14, 24, 34, and 44 are at substantially the midpoint of the tubes 10, 20, 30, and 40, respectively. Thus, the refrigerant at the vicinity of each of the bent portions 14, 24, 34, and 44 is at a relatively medium temperature. Accordingly, it is unlikely that there is a large difference in temperature of air passing through these vicinities.

The flow channels P1 and P2 in the chamber C1 and the flow channels P3 to P5 in the chamber C2 in the radiator 4 according to the present embodiment are arranged in a direction perpendicular to the direction in which the tubes 10 to 80 extend, as illustrated in FIG. 3. Thus, a reduction in the width W of the tank 90, the width W being parallel with the direction in which the tubes 10 to 80 extend, is achieved, as illustrated in FIG. 4. This enables a reduction in the ratio of the size of the tank 90 to the entire size of the radiator 4. Correspondingly, each of the tubes 10 to 80 may have a sufficient length. Accordingly, dissipation efficiency of the refrigerant may be enhanced. In particular, as illustrated in FIG. 2, when air from the fan 5 flows in the direction WD, which is perpendicular to the direction in which the tubes 10 to 80 extend, dissipation efficiency of the refrigerant may be enhanced by the reduced width W of the tank 90.

In the present embodiment, as previously described, the tubes 10 to 80 connected to the tank 90 are arranged in parallel with one other. Another case where, instead of the tubes 10 to 40, a single tube having the same length as the total length of the tubes 10 to 40 is used in causing the refrigerant to flow from the chamber C1 to the chamber C2 is discussed below, for example. In this case, the long tube is bent many times in the vicinity of the tank 90, and thus the single tube includes a large number of bent portions. If refrigerant flows into such a single tube, the pressure is lost in the large number of bent portions, so the refrigerant may be unable to flow into the tube at a uniform speed and with a uniform flow rate. In contrast this, in the present embodiment, each of the tubes includes only one bent portion, and these tubes are arranged in parallel with one other and connected to the tank 90. Thus, a pressure loss in the refrigerant in the bent portions may be reduced. Accordingly, for example, a load in the pump 3 for transporting the refrigerant is lowered.

Each of the tubes 10 to 80 is flat-shaped. Thus, a reduction in the profile of the entire radiator 4 may be accomplished. This enables a size reduction in the radiator 4.

In the present embodiment, the flow channels P1 and P2 in the chamber C1 and the flow channels P3 to P5 in the chamber C2 are alternately positioned in a direction perpendicular to the direction in which the tubes 10 to 80 extend from the tank 90. Thus, the refrigerant may flow as the above-described state, while at the same time the plurality of tubes 10 to 40 may be positioned next to one another and the plurality of tubes 50 to 80 may be positioned next to one another. For example, if the radiator includes tubes more than the tubes in the present embodiment, the chambers C1 and C2 include additional flow channels such that the flow channels in the chamber C1 and those in the chamber C2 are alternately arranged. In this way, the radiator may include more tubes, while at the same time imbalances in temperature distribution of air passing through the surroundings of the radiator are reduced.

In the present embodiment, the case where the refrigerant is introduced through the nozzle OP1 and ejected through the nozzle OP2 is described as an example. Other directions may also be used as the direction in which the refrigerant flows. The same applies to other embodiments described below. For example, the refrigerant may be introduced through the nozzle OP2 and ejected through the nozzle OP1. In this case, the direction in which the refrigerant flows is opposite to that illustrated in FIGS. 2 and 3. Even in this case, because relatively high temperature sections and relatively low temperature sections are alternately arranged, imbalances in temperature distribution of air passing through the surroundings of the radiator 4 are reduced.

In the present embodiment, the tubes 10 to 40 are connected to the side surface 95 of the tank 90, and the tubes 50 to 80 are connected to the side surface 96. Other structures may also be used. For example, a plurality of tubes may be connected to only one side surface of the tank, and no tubes may be connected to another side surface of the tank. Alternatively, a plurality of tubes may be connected to only one side surface of the tank, and a single tube may be connected to another side surface of the tank. The same applies to other embodiments described below.

The nozzles OP1 and OP2 are described above as being disposed on the front surface 91 of the tank 90. Other structures may also be used. For example, the nozzles OP1 and OP2 may be disposed on different surfaces of the tank 90. The same applies to other embodiments described below.

The chamber C2 is disposed such that at least part thereof is sandwiched between the flow channels P1 and P2. The flat portions 12, 22, and other flat portions may not be parallel with one other.

Second Embodiment

Figure 6:
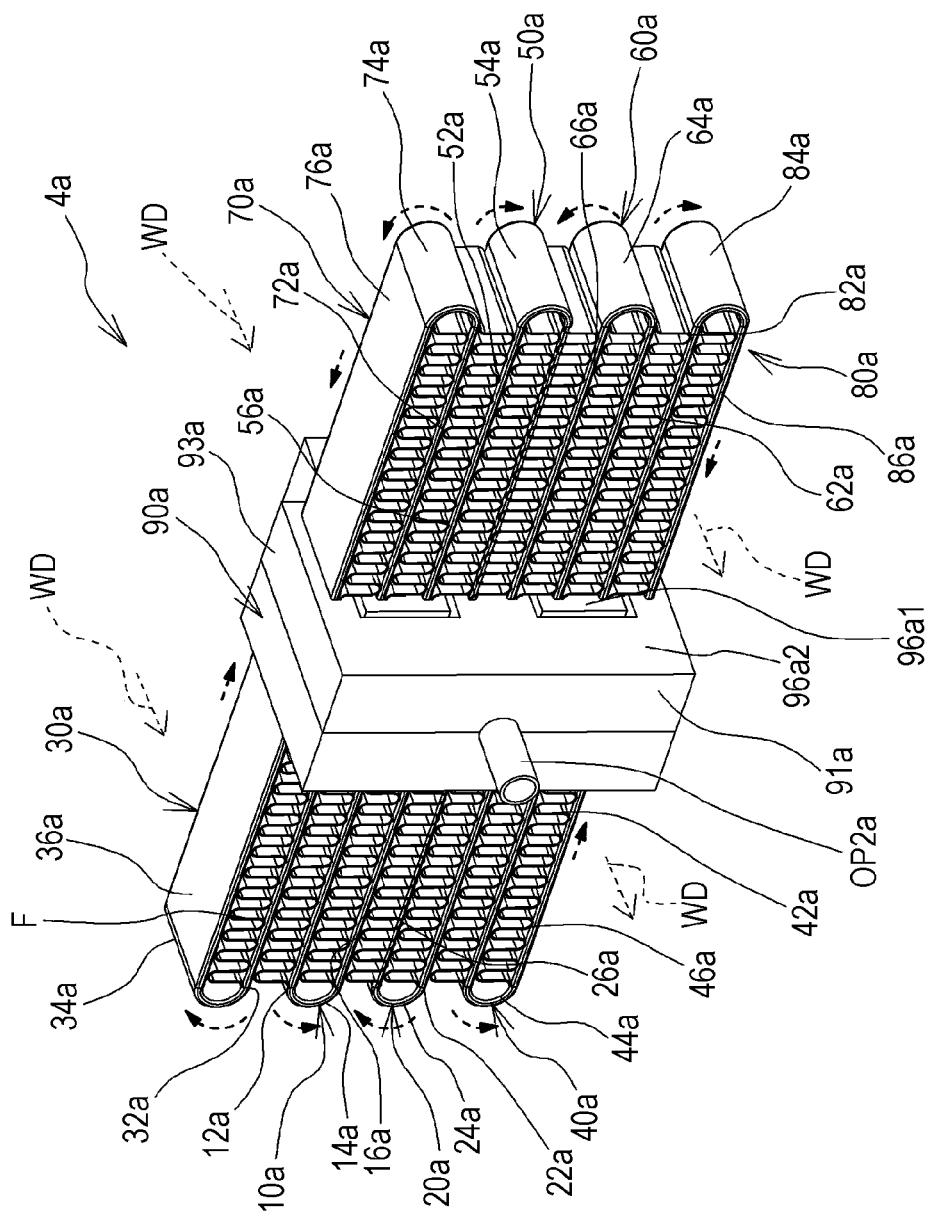
FIG. 6 illustrates a radiator according to a second embodiment.

A radiator 4a according to a second embodiment is described here. Similar portions in the radiator 4a to those in the radiator 4 according to the first embodiment have similar reference numerals to those in the radiator 4 and are not described here. FIG. 6 illustrates the radiator 4a according to the second embodiment.

The radiator 4a includes tubes 10a, 20a, 30a, 40a, 50a, 60a, 70a, and 80a, which are referred to as tubes 10a to 80a for simplicity, and a tank 90a connected to the tubes 10a to 80a. The tank 90a includes a front surface 91a on which a nozzle OP2a is disposed. The tube 10a includes a flat portion 12a straightly extending in a predetermined direction, a bent portion 14a contiguous with the flat portion 12a, and a flat portion 16a contiguous with the bent portion 14a and extending in parallel to the flat portion 12a. Similarly, the tube 20a includes flat portions 22a and 26a and a bent portion 24a. The tube 30a includes flat portions 32a and 36a and a bent portion 34a. The tube 40a includes flat portions 42a and 46a and a bent portion 44a. The tube 50a includes flat portions 52a and 56a and a bent portion 54a. The tube 60a includes flat portions 62a and 66a and a bent portion 64a. The tube 70a includes flat portions 72a and 76a and a bent portion 74a. The tube 80a includes flat portions 82a and 86a and a bent portion 84a.

The flat portions 12a and 32a face each other. The flat portions 16a and 26a face each other. The flat portions 22a and 42a face each other. The flat portions 52a and 72a face each other. The flat portions 56a and 66a face each other. The flat portions 62a and 82a face each other. A plurality of fins F are disposed between the flat portions 12a and 16a, between the flat portions 22a and 26a, between the flat portions 32a and 36a, between the flat portions 42a and 46a, between the flat portions 52a and 56a, between the flat portions 62a and 66a, between the flat portions 72a and 76a, and between the flat portions 82a and 86a. A plurality of fins F are also disposed between the flat portions 12a and 32a, between the flat portions 16a and 26a, between the flat portions 22a and 42a, between the flat portions 52a and 72a, between the flat portions 56a and 66a, and between the flat portions 62a and 82a.

Figure 7:
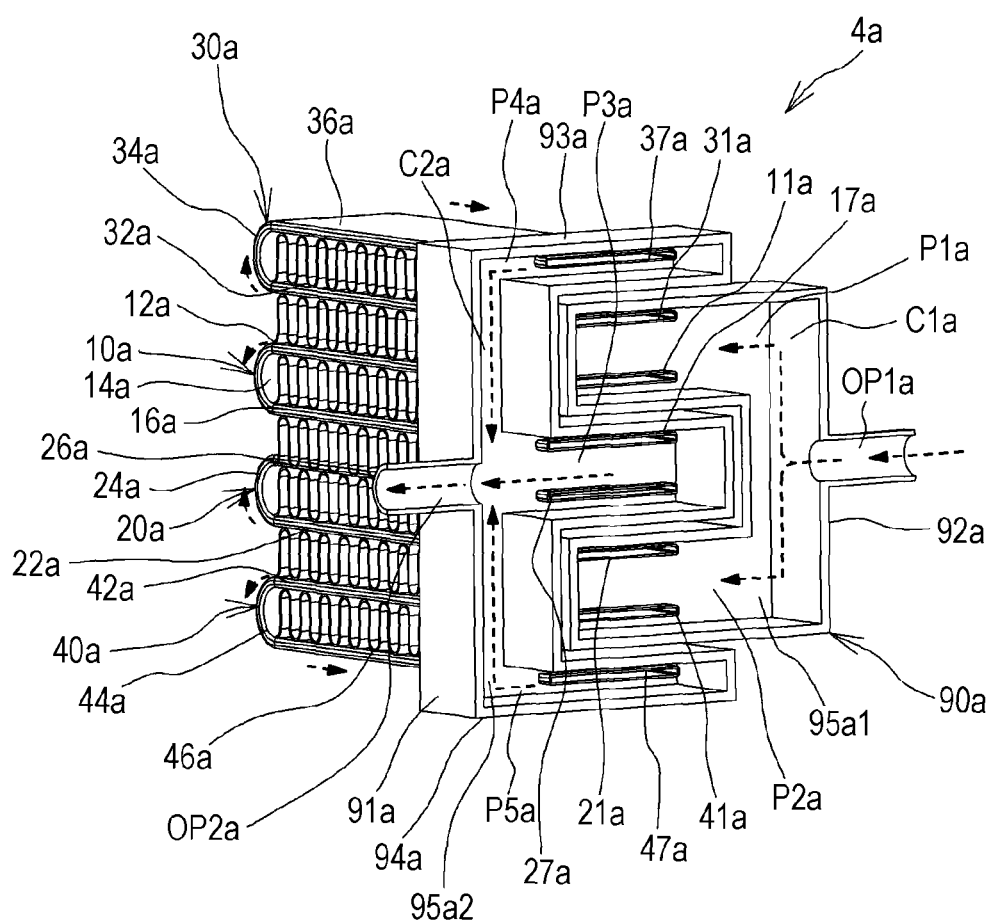
FIG. 7 illustrates a tank in the radiator according to the second embodiment.

FIG. 7 illustrates the tank 90a in the radiator 4a according to the second embodiment. The tank 90a includes two chambers C1a and C2a. The chamber C1a includes a nozzle OP1a. The chamber C2a includes the nozzle OP2a. The nozzles OP1a and OP2a extend in the opposite directions from the opposite sides. The chamber C1a defines a rear surface 92a of the tank 90a. The chamber C2a defines the front surface 91a, a top surface 93a, and a bottom surface 94a of the tank 90a. The chamber C2a also defines side surfaces 95a2 and 96a2 opposed to each other. The chamber C1a also defines side surfaces 95a1 and 96a1 opposed to each other. Both the side surface 95a1 of the chamber C1a and the side surface 95a2 of the chamber C2a define one single side surface of the tank 90a. Similarly, both the side surface 96a1 of the chamber C1a and the side surface 96a2 of the chamber C2a define another single side surface of the tank 90a.

The nozzle OP2a is disposed along the extension of a horizontal line passing through a flow channel P3a. The refrigerant having passed through the flow channels P3a, P4a, and P5a is ejected through the nozzle OP2a to the outside.

With the above-described structure, the temperature at the vicinity of the ends 11a and 31a and that of the ends 21a and 41a are relatively high, whereas the temperature at the vicinity of the ends 17a and 27a, that of the end 37a, and that of the end 47a are relatively low. Accordingly, the relatively high temperature sections and the relatively low temperature sections are alternately arranged, and imbalances in temperature distribution of air passing through the surroundings of the radiator 4a are reduced. As for the direction in which the refrigerant flows, the refrigerant may also be introduced through the nozzle OP2a and ejected through the nozzle OP1a.

In the present embodiment, the tank 90a may be produced by individually producing the chambers C1a and C2a and then combining them.

Third Embodiment

FIG. 8 illustrates a radiator 4a' according to a third embodiment. Similar portions in the radiator 4a' to those in the radiator 4a according to the second embodiment have similar reference numerals to those in the radiator 4a and are not described here. A tube 10a' includes flat portions 12a' and 16a' connected to a coupling chamber 14a'. The flat portions 12a' and 16a' are members extending in parallel with each other and having the same shape and size. One end of each of the flat portions 12a' and 16a' is connected to the tank 90a, and another end of each of the flat portions 12a' and 16a' is connected to the coupling chamber 14a'. The refrigerant having flowed along the flat portion 12a' flows through the coupling chamber 14a' and then flows along the flat portion 16a'. The flat portions 12a' and 16a' are examples of first and second paths extending along each other from the tank. The coupling chamber 14a' is an example of a coupling chamber that couples the first and second paths.

Similarly, a tube 20a' includes flat portions 22a' and 26a' and a coupling chamber 24a'. A tube 30a' includes flat portions 32a' and 36a' and a coupling chamber 34a'. A tube 40a' includes flat portions 42a' and 46a' and a coupling chamber 44a'. A tube 50a' includes flat portions 52a' and 56a' and a coupling chamber 54a'. A tube 60a' includes flat portions 62a' and 66a' and a coupling chamber 64a'. A tube 70a' includes flat portions 72a' and 76a' and a coupling chamber 74a'. A tube 80a' includes flat portions 82a' and 86a' and a coupling chamber 84a'. The coupling chambers 14a', 24a', 34a', and 44a' do not communicate with one another. Similarly, the coupling chambers 54a', 64a', 74a', and 84a' do not communicate with one another. Unlike in the second embodiment, each of the tubes includes no bent portion. Thus, each tube may be produced by a simple method at low cost.

Fourth Embodiment

Figure 9A:
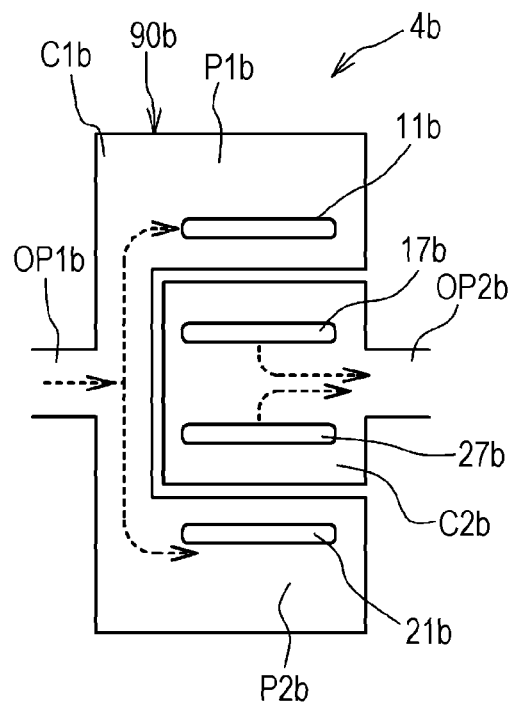
FIG. 9A is an illustration for describing a radiator according to a fourth embodiment.

FIG. 9A is an illustration for describing a radiator 4b according to a fourth embodiment. FIG. 9A illustrates only an internal structure of a tank 90b of the radiator 4b. No split flow channels are disposed in a chamber C2b. The chamber C2b is sandwiched between flow channels P1b and P2b. In this case, two tubes are connected to one side surface of the tank 90b, whereas other two tubes are connected to another side surface of the tank 90b. One end 11b of one tube is connected to the flow channel P1b in a chamber C1b, whereas another end 17b thereof is connected to the chamber C2b. One end 21b of another tube is connected to the flow channel P2b in the chamber C1b, whereas another end 27b thereof is connected to the chamber C2b. In this structure, the temperature at the vicinity of the end 11b and that of the end 21b are relatively high, whereas the temperature at the vicinity of the ends 17b and 27b is relatively low. Accordingly, the relatively low temperature section is sandwiched between the relatively high temperature sections. Thus, imbalances in temperature distribution of air passing through the surroundings of the radiator 4b are reduced.

Fifth Embodiment

Figure 9B:
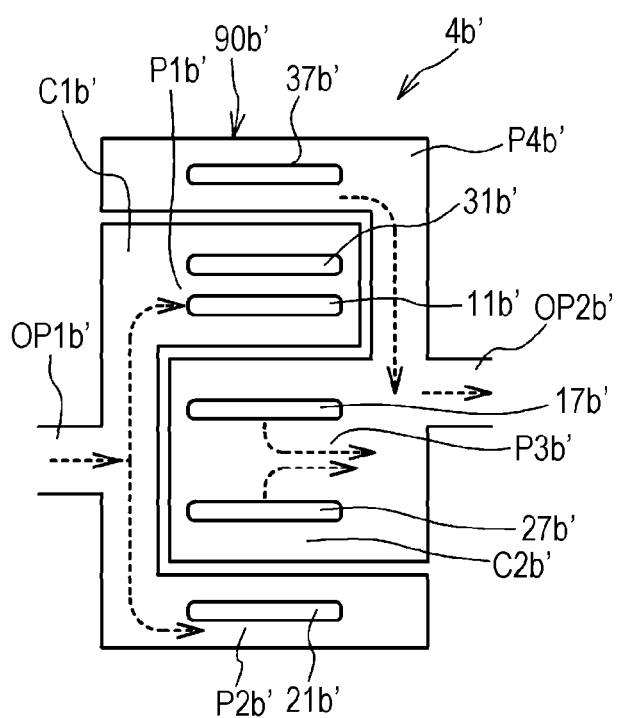
FIG. 9B is an illustration for describing a radiator according to a fifth embodiment.

FIG. 9B is an illustration for describing a radiator 4b' according to a fifth embodiment. Similar portions in the radiator 4b' to those in the radiator 4b according to the fourth embodiment have similar reference numerals to those in the radiator 4b and are not described here. A chamber C2b' includes split flow channels P3b' and P4b' communicating with a nozzle OP2b'. The flow channels P3b' and P4b' sandwich a flow channel P1b' in a chamber C1b'. Three tubes are connected to one side surface of the tank 90b'. An end 31b' of the uppermost tube connected to the tank 90b' is connected to the flow channel P1b', and another end 37b' thereof is connected to the flow channel P4b'.

In this structure, the temperature at each of the vicinity of the ends 11b' and 31b' and the vicinity of the end 21b' is relatively high, whereas the temperature at each of the vicinity of the ends 17b' and 27b' and the vicinity of the end of the end 37b' is relatively low. Accordingly, the relatively high temperature ends 11b' and 31b' are sandwiched between the relatively low temperature ends 17b' and 27b' and the relatively low temperature end 37b'. The relatively low temperature ends 17b' and 27b' are sandwiched between the relatively high temperature ends 11b' and 31b' and the relatively high temperature end 21b'. Thus, imbalances in temperature distribution of air passing through the surroundings of the radiator 4b' are reduced.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A radiator comprising:
a tank including first and second chambers that are separated from each other, the first and second chambers including first and second openings, respectively;
a first tube including first and second ends, the first and second ends communicating with the first and second chambers, respectively; and
a second tube being next to the first tube, the second tube including first and second ends communicating with the first and second chambers, respectively,
wherein the first chamber includes first and second flow channels that communicate with the first opening, the first and second flow channels being split so as to sandwich at least part of the second chamber, and
the first ends of the first and second tubes sandwich the second ends of the first and second tubes.

2. The radiator according to claim 1,
wherein the second chamber includes third and fourth flow channels that communicate with the second opening, the third and fourth flow channels being split so as to sandwich the first flow channel, and
the second end of each of the first and second tubes communicates with the third flow channel in the second chamber, and
the radiator further includes a third tube that includes a first end communicating with the first flow channel in the first chamber and a second end communicating with the fourth flow channel in the second chamber.

3. The radiator according to claim 2,
wherein the second chamber includes a fifth flow channel that communicates with the second opening, the second opening being split from the third and fourth flow channels such that the third and fifth flow channels sandwich the second flow channel,
the radiator further includes a fourth tube that includes a first end communicating with the second flow channel in the first chamber and a second end communicating with the fifth flow channel in the second chamber.

4. The radiator according to claim 1,
wherein the first and second flow channels and the at least part of the second chamber are arranged in a direction perpendicular to a direction in which the first and second tubes extend from the tank.

5. The radiator according to claim 2,
wherein the first and second flow channels and the at least part of the second chamber are arranged in a direction perpendicular to a direction in which the first and second tubes extend from the tank.

6. The radiator according to claim 3,
wherein the first and second flow channels and the at least part of the second chamber are arranged in a direction perpendicular to a direction in which the first and second tubes extend from the tank.

7. The radiator according to claim 1,
wherein the first tube includes a first-side first tube connected to a first side surface of the tank and a second-side second tube connected to a second side surface of the tank, the second side surface being opposed to the first side surface.

8. The radiator according to claim 2,
wherein the first tube includes a first-side first tube connected to a first side surface of the tank and a second-side second tube connected to a second side surface of the tank, the second side surface being opposed to the first side surface.

9. The radiator according to claim 3,
wherein the first tube includes a first-side first tube connected to a first side surface of the tank and a second-side second tube connected to a second side surface of the tank, the second side surface being opposed to the first side surface.

10. The radiator according to claim 4,
wherein the first tube includes a first-side first tube connected to a first side surface of the tank and a second-side second tube connected to a second side surface of the tank, the second side surface being opposed to the first side surface.

11. The radiator according to claim 1,
wherein the second ends of the first and second tubes are next to each other.

12. The radiator according to claim 2,
wherein the second ends of the first and second tubes are next to each other.

13. The radiator according to claim 3,
wherein the second ends of the first and second tubes are next to each other.

14. The radiator according to claim 4,
wherein the second ends of the first and second tubes are next to each other.

15. The radiator according to claim 7,
wherein the second ends of the first and second tubes are next to each other.

16. The radiator according to claim 1,
wherein the first tube includes first and second paths extending along each other from the tank and a coupling chamber that couples the first and second paths.

17. The radiator according to claim 2,
wherein the first tube includes first and second paths extending along each other from the tank and a coupling chamber that couples the first and second paths.

18. The radiator according to claim 3,
wherein the first tube includes first and second paths extending along each other from the tank and a coupling chamber that couples the first and second paths.

19. An electronic apparatus comprising a radiator, the radiator including
a tank including first and second chambers that are separated from each other, the first and second chambers including first and second openings, respectively,
a first tube including first and second ends, the first and second ends communicating with the first and second chambers, respectively, and
a second tube being next to the first tube, the second tube including first and second ends communicating with the first and second chambers, respectively, wherein the first chamber includes first and second flow channels that communicate with the first opening, the first and second flow channels being split so as to sandwich at least part of the second chamber, and the first ends of the first and second tubes sandwich the second ends of the first and second tubes.

\* \* \* \* \*